United States Patent
See et al.

(10) Patent No.: US 9,054,756 B2
(45) Date of Patent: *Jun. 9, 2015

(54) ADAPTIVE TUNING OF AN IMPEDANCE MATCHING CIRCUIT IN A WIRELESS DEVICE

(75) Inventors: Puay Hoe See, San Diego, CA (US); Xiangdong Zhang, Westford, MA (US)

(73) Assignee: QUALCOMM Incorporated, San Diego, CA (US)

( * ) Notice: Subject to any disclaimer, the term of this patent is extended or adjusted under 35 U.S.C. 154(b) by 728 days.

This patent is subject to a terminal disclaimer.

(21) Appl. No.: 13/236,423

(22) Filed: Sep. 19, 2011

(65) Prior Publication Data

US 2013/0069737 A1    Mar. 21, 2013

(51) Int. Cl.
*H03H 7/40*  (2006.01)
*H04B 1/04*  (2006.01)
*H04B 1/18*  (2006.01)

(52) U.S. Cl.
CPC ............ *H04B 1/0458* (2013.01); *H04B 1/18* (2013.01); *H03H 7/40* (2013.01)

(58) Field of Classification Search
CPC ...................................................... H03H 7/40
USPC .................................................. 333/32, 17.3
See application file for complete search history.

(56) References Cited

U.S. PATENT DOCUMENTS

| | | |
|---|---|---|
| 2005/0130699 A1 | 6/2005 | Kim et al. |
| 2010/0073103 A1 | 3/2010 | Spears et al. |
| 2011/0043285 A1 | 2/2011 | Zhao et al. |

FOREIGN PATENT DOCUMENTS

| | | |
|---|---|---|
| JP | 2008011341 A | 1/2008 |
| JP | 2010087768 A | 4/2010 |
| JP | 2012199710 A | 10/2012 |

OTHER PUBLICATIONS

International Search Report and Written Opinion—PCT/US2012/056131, International Search Authority—European Patent Office, Oct. 15, 2013.
Partial International Search Report—PCT/US2012/056131—ISA/EPO—Aug. 2, 2013.
Song, et al., "A Mixed-Signal Matching State Search Based Adaptive Antenna Tuning IC", IEEE Microwave and Wireless Components Letters, vol. 20, No. 10, Oct. 2010, pp. 581-583.

*Primary Examiner* — Stephen E Jones
(74) *Attorney, Agent, or Firm* — James Gutierrez (57) ABSTRACT

Techniques for adaptively tuning an impedance matching circuit are disclosed. In an aspect, the impedance matching circuit is pre-characterized. The performance of the impedance matching circuit is determined for multiple settings of the impedance matching circuit, stored in memory, and used to tune the impedance matching circuit. In another aspect, the impedance matching circuit is tuned based on measurements for one or more parameters such as delivered power, return loss, power amplifier current, antenna/load impedance, etc. In an exemplary design, an apparatus includes a memory and a control unit. The memory stores information for multiple settings of an impedance matching circuit. The control unit selects one of the multiple settings of the impedance matching circuit based on the information for the multiple settings and measurements for the impedance matching circuit. The impedance matching circuit performs impedance matching for a load circuit (e.g., an antenna) based on the selected setting.

14 Claims, 10 Drawing Sheets

| Circuit Setting | Freq | Config | Switch Settings | Control Settings | Band/ Mode |
|---|---|---|---|---|---|
| 1 | F1 | Config a | SW1 ... | C1 ... | B1 |
| 2 | F2 | Config b | SW1 ... | C1 ... | B2 |
| ⋮ | ⋮ | ⋮ | ⋮ | ⋮ | ⋮ |
| K | FK | Config b | SW1 ... | C1 ... | BK |

ADAPTIVE TUNING OF AN IMPEDANCE MATCHING CIRCUIT IN A WIRELESS DEVICE

BACKGROUND

I. Field

The present disclosure relates generally to electronics, and more specifically to techniques for tuning an impedance matching circuit in a wireless device.

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may include various circuits such as a power amplifier (PA), a filter, etc. The receiver may also include various circuits such as a low noise amplifier (LNA), a filter, etc. An impedance matching circuit may be coupled between the antenna and the transmitter and/or the receiver and may perform impedance matching for the antenna, the power amplifier, or the LNA. The impedance matching circuit may have a large impact on the performance of the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for tuning/adjusting an impedance matching circuit in a wireless device are described herein. The techniques may be used for wireless devices of various types such as cellular phones, smart phones, tablets, personal digital assistants (PDAs), handheld devices, wireless modems, laptop computers, smartbooks, netbooks, cordless phones, wireless local loop (WLL) stations, Bluetooth devices, consumer electronic devices, etc.

Figure 1:
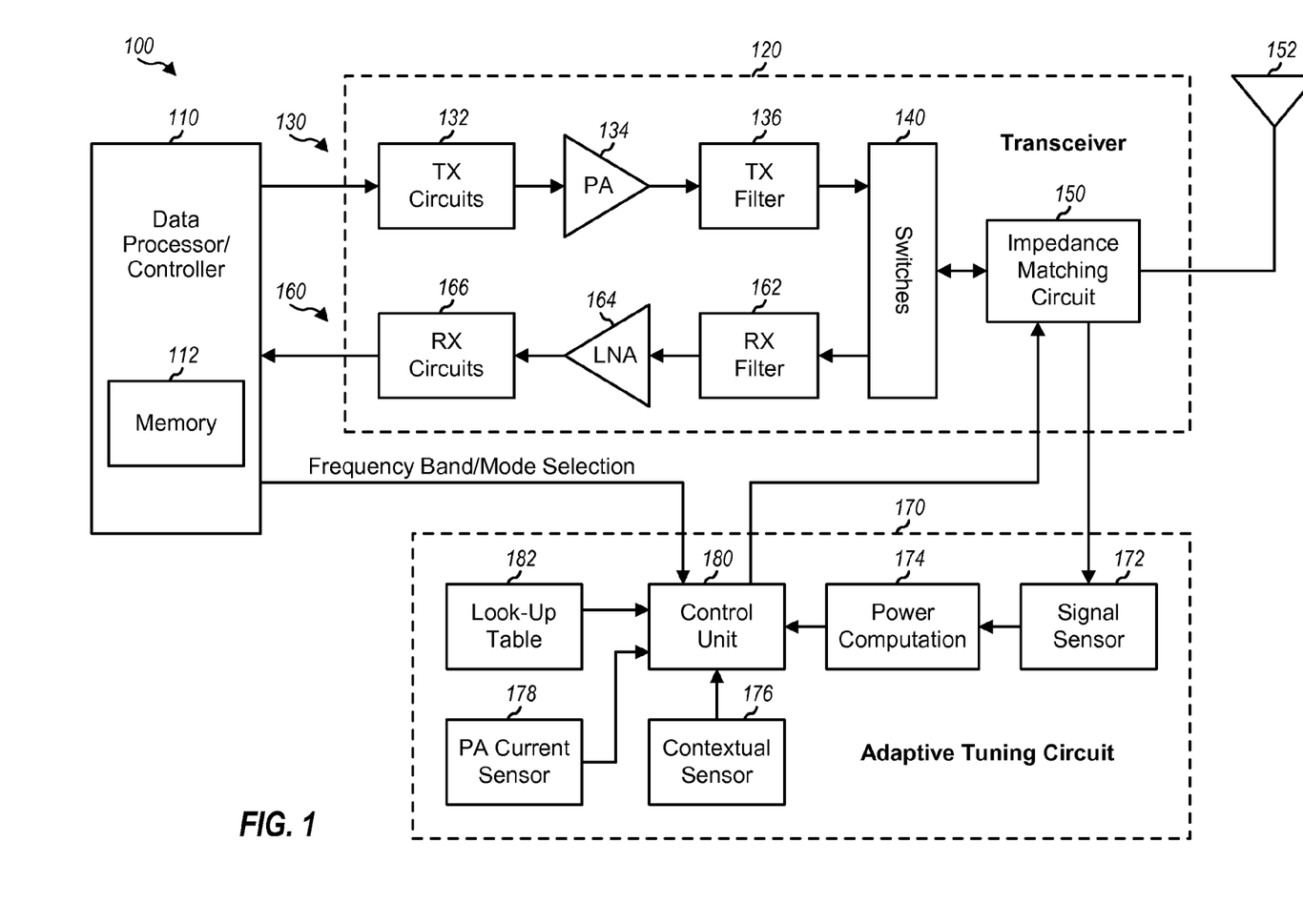
FIGS. 1, 2 and 3 show three exemplary designs of a wireless device.

FIG. 1 shows a block diagram of an exemplary design of a wireless device 100. In this exemplary design, wireless device 100 includes a data processor/controller 110, a transceiver 120, an adaptive tuning circuit 170, and an antenna 152. Transceiver 120 includes a transmitter 130 and a receiver 160 that support bi-directional wireless communication. Wireless device 100 may support Long Term Evolution (LTE), Code Division Multiple Access (CDMA) 1X or cdma2000, Wideband CDMA (WCDMA), Global System for Mobile Communications (GSM), IEEE 802.11, etc.

In the transmit path, data processor 110 processes (e.g., encodes and modulates) data to be transmitted and provides an analog output signal to transmitter 130. Within transmitter 130, transmit (TX) circuits 132 amplify, filter, and upconvert the analog output signal from baseband to RF and provide a modulated signal. TX circuits 132 may include amplifiers, filters, mixers, an oscillator, a local oscillator (LO) generator, a phase locked loop (PLL), etc. A power amplifier (PA) 134 receives and amplifies the modulated signal and provides an amplified RF signal having the proper output power level. A TX filter 136 filters the amplified RF signal to pass signal components in a transmit band and attenuate signal components in a receive band. TX filter 136 provides an output RF signal, which is routed through switches 140 and an impedance matching circuit 150 and transmitted via antenna 152. Impedance matching circuit 150 performs impedance matching for antenna 152 and is also referred to as an antenna tuning circuit, a tunable matching circuit, etc.

In the receive path, antenna 152 receives signals from base stations and/or other transmitter stations and provides a received RF signal, which is routed through impedance matching circuit 150 and switches 140 and provided to receiver 160. Within receiver 160, a receive (RX) filter 162 filters the received RF signal to pass signal components in the receive band and attenuate signal components in the transmit band. An LNA 164 amplifies a filtered RF signal from RX filter 162 and provides an input RF signal. RX circuits 166 amplify, filter, and downconvert the input RF signal from RF to baseband and provide an analog input signal to data processor 110. RX circuits 166 may include amplifiers, filters, mixers, an oscillator, an LO generator, a PLL, etc.

Adaptive tuning circuit 170 tunes or adjusts impedance matching circuit 150 such that good performance can be achieved for data transmission and reception. Within adaptive tuning circuit 170, a sensor 172 receives input signals from impedance matching circuit 150 and measures the voltage, current, power, and/or other characteristics of the input signals. A computation unit 174 receives the measurements from sensor 172 and determines the delivered power and/or the impedance of the load observed by impedance matching circuit 150, which is antenna 152 in FIG. 1. A control unit 180 receives the delivered power and/or impedance from computation unit 174. Control unit 180 may also receive the outputs of contextual sensors 176, PA current from a PA current sensor 178, and a control signal indicative of a selected frequency band/channel and/or a selected mode from processor 110. Control unit 180 may also receive performance characterizations for different possible settings of impedance matching circuit 150 from a look-up table 182. Control unit 180 generates a control to tune impedance matching circuit 150 to achieve good performance, e.g., to obtain higher delivered power to the load.

FIG. 1 shows an exemplary design of adaptive tuning circuit 170. An adaptive tuning circuit may also include fewer, different and/or other sensors. Computation unit 174 may be separate from control unit 180 (as shown in FIG. 1) or may be part of control unit 180. All or part of adaptive tuning circuit 170 may be implemented digitally. For example, computation unit 174 and control unit 180 may be implemented by data processor/controller 110. Look-up table 182 may be stored in memory 112 or some other memory.

FIG. 1 shows an exemplary design of transceiver 120 and adaptive tuning circuit 170. All or a portion of transceiver 120 and adaptive tuning circuit 170 may be implemented on one or more analog integrated circuits (ICs), RF ICs (RFICs), mixed-signal ICs, etc. Power amplifier 134 and possibly other circuits may be implemented on a separate IC or module. Impedance matching circuit 150 and possibly other circuits may also be implemented on a separate IC or module.

Data processor/controller 110 may perform various functions for wireless device 100. For example, data processor 110 may perform processing for data being transmitted via transmitter 130 and received via receiver 160. Controller 110 may control the operation of TX circuits 132, RX circuits 166, switches 140, and/or adaptive tuning circuit 170. Memory 112 may store program codes and data for data processor/controller 110. Memory 112 may be internal to data processor/controller 110 (as shown in FIG. 1) or external to data processor/controller 110 (not shown in FIG. 1). Data processor/controller 110 may be implemented on one or more application specific integrated circuits (ASICs) and/or other ICs.

Figure 2:
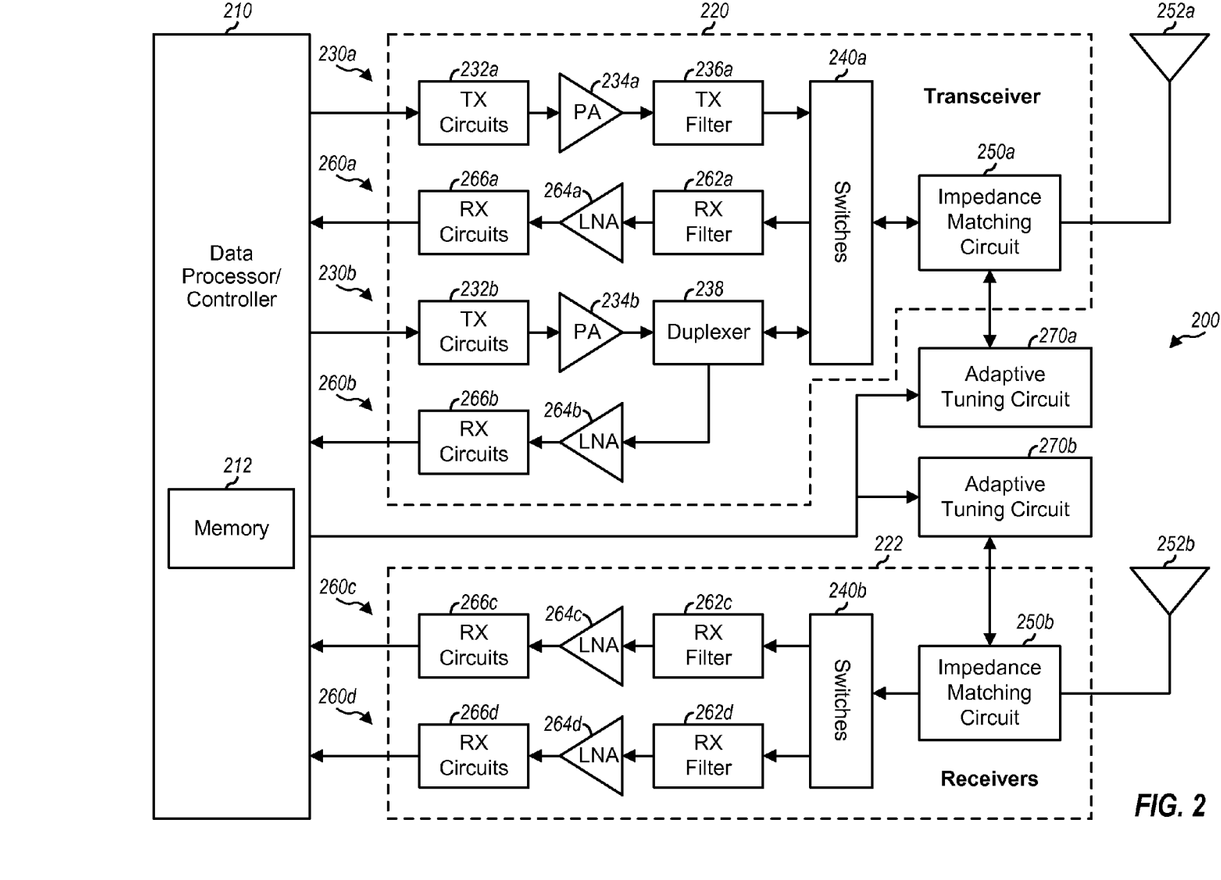

FIG. 2 shows a block diagram of an exemplary design of a wireless device 200. In this exemplary design, wireless device 200 includes a data processor/controller 210, a transceiver 220 and an adaptive tuning circuit 270a for a primary antenna 252a, and receivers 222 and an adaptive tuning circuit 270b for a secondary antenna 252b. Transceiver 220 includes (i) a transmitter 230a and a receiver 260a that support bi-directional wireless communication for a first mode/band (e.g., GSM) and (ii) a transmitter 230b and a receiver 260b that support bi-directional wireless communication for a second mode/band (LTE, cdma2000, or WCDMA). A mode may correspond to LTE, cdma2000, WCDMA, GSM, etc. Receivers 222 include receivers 260c and 260d that support data reception. Adaptive tuning circuits 270a and 270b may each be implemented as shown in FIG. 1.

Within transceiver 220, transmitter 230a includes TX circuits 232a, a power amplifier 234a, and a TX filter 236a. Receiver 260a includes an RX filter 262a, an LNA 264a, and RX circuits 266a. Transmitter 230b includes TX circuits 232b, a power amplifier 234b, and a duplexer 238. Receiver 260b includes duplexer 238, an LNA 264b, and RX circuits 266b. Switches 240a are coupled to TX filter 236a, RX filter 262a, and duplexer 238. Duplexer 238 routes an amplified RF signal from power amplifier 234b to switches 240a and also routes a received RF signal from switches 240a to LNA 264b. An impedance matching circuit 250a is coupled between switches 240a and antenna 252a. Adaptive tuning circuit 270a is coupled to and adjusts impedance matching circuit 250a such that good performance can be achieved for data transmission and reception via antenna 252a.

Within receivers 222, receiver 260c includes an RX filter 262c, an LNA 264c, and RX circuits 266c. Receiver 260d includes an RX filter 262d, an LNA 264d, and RX circuits 266d. Switches 240b are coupled to RX filters 262c and 262d. An impedance matching circuit 250b is coupled between switches 240b and antenna 252b. Adaptive tuning circuit 270b is coupled to and adjusts impedance matching circuit 250b such that good performance can be achieved for data reception via antenna 252b.

Figure 3:
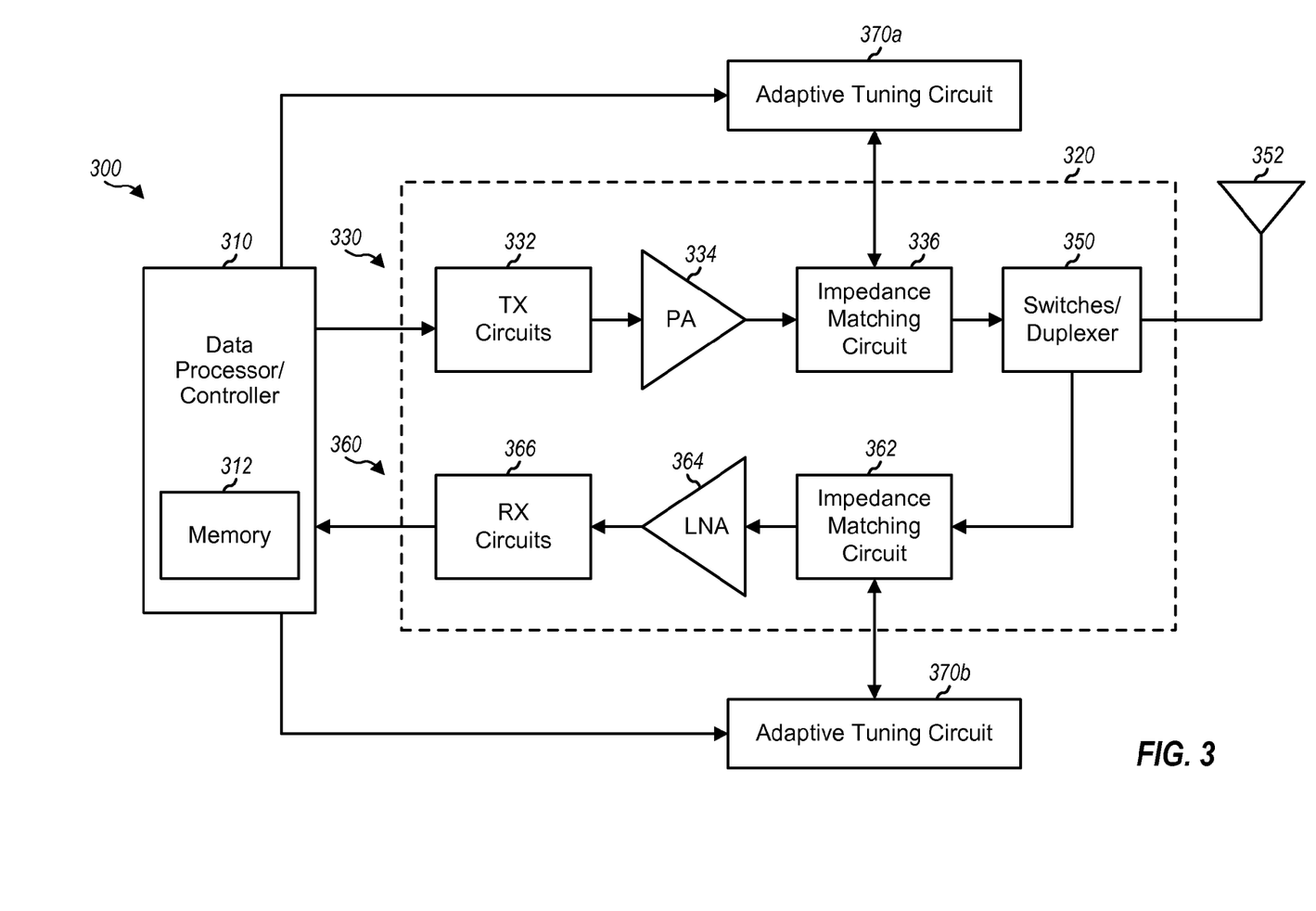

FIG. 3 shows a block diagram of an exemplary design of a wireless device 300. In this exemplary design, wireless device 300 includes a data processor/controller 310, a transceiver 320, adaptive tuning circuits 370a and 370b, and an antenna 352. Transceiver 320 includes a transmitter 330 and a receiver 360 that support bi-directional wireless communication. Transmitter 330 includes TX circuits 332, a power amplifier 334, and an impedance matching circuit 336 coupled in series. Receiver 360 includes an impedance matching circuit 362, an LNA 364, and RX circuits 366 coupled in series. Switches/duplexer 350 is coupled to impedance matching circuits 336 and 362 and also to antenna 352. Adaptive tuning circuit 370a is coupled to and adjusts impedance matching circuit 336 such that good performance can be achieved for data transmission via antenna 352. Adaptive tuning circuit 370b is coupled to and adjusts impedance matching circuit 362 such that good performance can be achieved for data reception via antenna 352. Adaptive tuning circuits 370a and 370b may each be implemented as shown in FIG. 1.

FIGS. 1, 2 and 3 show three exemplary designs of wireless devices 100, 200 and 300, respectively. In general, a wireless device may include any number of antennas, any number of transmitters, and any number of receivers. A wireless device may also support operation on any number of frequency bands. A wireless device may include one or more transmitters and/or one or more receivers for each antenna. Each transmitter and each receiver may support operation on one or more frequency bands for a given antenna.

A wireless device may support communication with time division duplex (TDD) system and/or frequency division duplex (FDD) systems. For communication with a TDD system, the wireless device may include switches (e.g., switches 140 in FIG. 1) that can couple an antenna to either a transmitter or a receiver at any given moment. For communication with a FDD system, the wireless device may include a duplexer (e.g., duplexer 238 in FIG. 2) that can simultaneously route (i) an output RF signal from a power amplifier to an antenna and (ii) a received RF signal from the antenna to an LNA.

As shown in FIGS. 1, 2 and 3, impedance matching circuits may be included at various locations in a wireless device and used to match the impedances of circuits coupled to the input and output of the impedance matching circuit. For example, an impedance matching circuit (e.g., impedance matching circuit 150 in FIG. 1) may perform impedance matching between an output impedance of a filter and an input impedance of an antenna. An impedance matching circuit (e.g., impedance matching circuit 336 in FIG. 3) may also perform impedance matching between an output impedance of an amplifier and an input impedance of a filter or an antenna.

In an aspect, an impedance matching circuit may be implemented with a set of reactive elements and a set of switches and may support multiple configurations. Such an impedance matching circuit may be referred to as a reconfigurable impedance matching circuit. The set of reactive elements and the set of switches may be connected in a particular topology, which may indicate how each reactive element and each switch is connected. A number of configurations may be supported with different settings of the switches. Different configurations may be associated with different impedance tuning curves. Each impedance tuning curve may correspond to a range of impedance values achievable by the impedance matching circuit for the associated configuration. The multiple configurations may enable the impedance matching circuit to provide better impedance matching for a load circuit, e.g., an antenna. The reconfigurable impedance matching circuit may be able to tune over a wider range of impedance values and may be able to provide better impedance matching for a load circuit over a wider range of frequencies.

In an exemplary design, a reconfigurable impedance matching circuit may include at least one variable reactive element, each having an impedance that can be varied. The variable reactive element(s) may enable the impedance of the reconfigurable impedance matching circuit to be tuned to provide better impedance matching, which may improve performance.

In an exemplary design, a reconfigurable impedance matching circuit may include at least one reconfigurable reactive element, each of which can be connected as a series element or a shunt element via at least one switch. For example, a reconfigurable inductor may be connected as a series inductor in one configuration and as a shunt inductor in another configuration. The reconfigurable reactive element(s) may enable the impedance of the reconfigurable impedance matching circuit to be tuned over a wider range of impedance values, which may provide better impedance matching.

Figure 4:
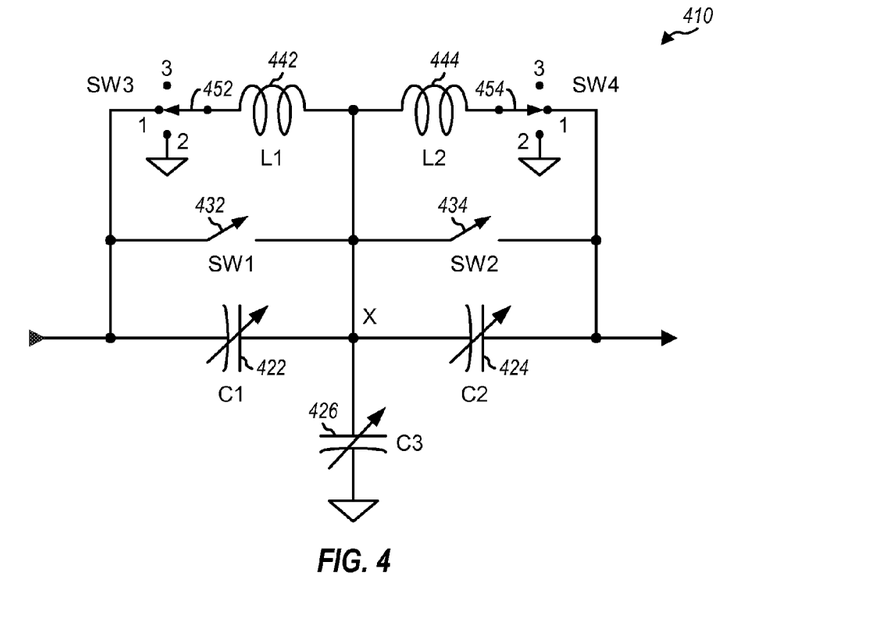
FIG. 4 shows a schematic diagram of an impedance matching circuit.

FIG. 4 shows a schematic diagram of an exemplary design of a reconfigurable impedance matching circuit 410, which may be used for any of the impedance matching circuits in FIGS. 1, 2 and 3. Within impedance matching circuit 410, a variable capacitor (varactor) 422 (C1) is coupled between an input of impedance matching circuit 410 and node X. A varactor 424 (C2) is coupled between node X and an output of impedance matching circuit 410. A varactor 426 (C3) is coupled between node X and circuit ground. A switch 432 (SW1) is coupled between the input of impedance matching circuit 410 and node X. A switch 434 (SW2) is coupled between node X and the output of impedance matching circuit 410. An inductor 442 (L1) is coupled between node X and an input of a switch 452 (SW3). Switch 452 has a first output ('1') coupled to the input of impedance matching circuit 410, a second output ('2') coupled to circuit ground, and a floating third output ('3') that is not coupled to any circuit element. An inductor 444 (L2) is coupled between node X and an input of a switch 454 (SW4). Switch 454 has a first output ('1') coupled to the output of impedance matching circuit 410, a second output ('2') coupled to circuit ground, and a floating third output ('3'). Switch 452 may be implemented with (i) a first switch coupled between inductor L1 and the input of impedance matching circuit 410 and (ii) a second switch coupled between inductor L1 and circuit ground. Switch 454 may also be implemented with a pair of switches in a similar manner as switch 452.

Switches SW1 and SW2 may each be opened or closed (i.e., placed in one of two possible states). Switches SW3 and SW4 may each be controlled to connect the input to the first, second, or third output (i.e., placed in one of three possible states). Varactors C1, C2 and C3 may each be set to a minimum capacitance value to obtain a high impedance and essentially provide an open. Varactors C1, C2 and C3 may have the same or different minimum capacitance values. Inductors 442 and 444 may each be coupled as a series element or a shunt element, as described below.

Impedance matching circuit 410 supports a number of configurations, some of which are described below. Each configuration is associated with a set of states/settings for switches SW1, SW2, SW3 and SW4. Each configuration may also be associated with specific values for varactors C1, C2 and/or C3.

FIGS. 5A to 5F show six configurations of impedance matching circuit 410 in FIG. 4. Each configuration may be obtained with the switch settings and varactor settings shown in a figure describing that configuration. For each configuration, the main electrical paths are shown by heavy dashed lines.

Figure 5A:
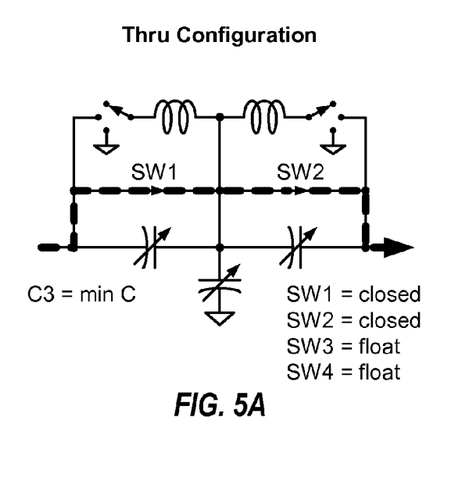
FIGS. 5A to 5F show six configurations of the impedance matching circuit in FIG. 4.

FIG. 5A shows impedance matching circuit 410 in a through configuration. In this configuration, an input signal is passed through switches SW1 and SW2 to the output of impedance matching circuit 410.

Figure 5B:
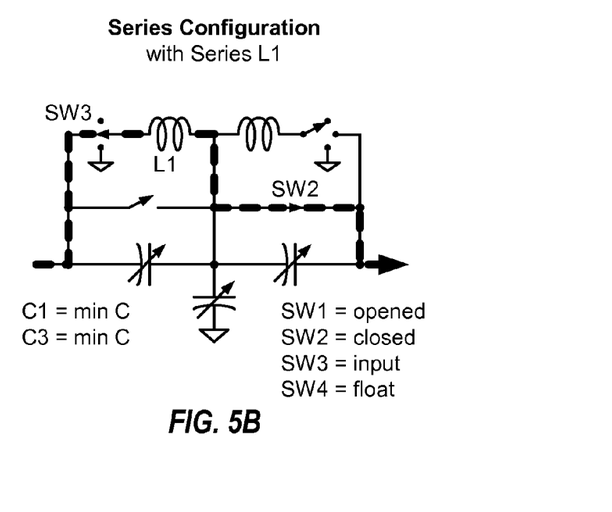

FIG. 5B shows impedance matching circuit 410 in a series configuration with a series L1. In this configuration, an input signal is passed through switch SW3, inductor L1, and switch SW2 to the output of impedance matching circuit 410.

Figure 5C:
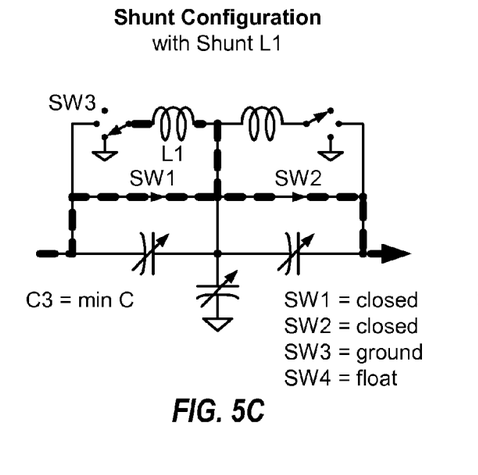

FIG. 5C shows impedance matching circuit 410 in a shunt configuration with a shunt L1. In this configuration, an input signal is passed through switch SW1, applied to inductor L1 (which is coupled to circuit ground via switch SW3), and passed through switch SW2 to the output of impedance matching circuit 410.

Figure 5D:
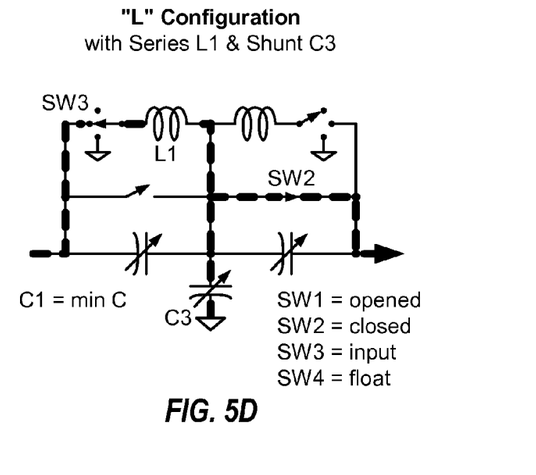

FIG. 5D shows impedance matching circuit 410 in an "L" configuration with series L1 and shunt C3. In this configuration, an input signal is passed through switch SW3 and inductor L1, applied to varactor C3, and passed through switch SW2 to the output of impedance matching circuit 410.

Figure 5E:
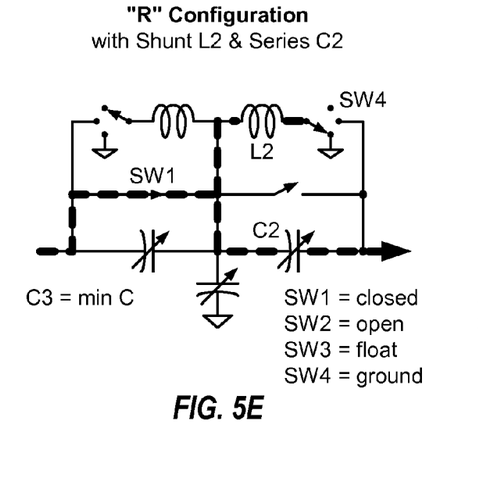

FIG. 5E shows impedance matching circuit 410 in an "R" configuration with shunt L2 and series C2. In this configuration, an input signal is passed through switch SW1, applied to inductor L2 (which is coupled to circuit ground via switch SW4), and passed through varactor C2 to the output of impedance matching circuit 410.

Figure 5F:
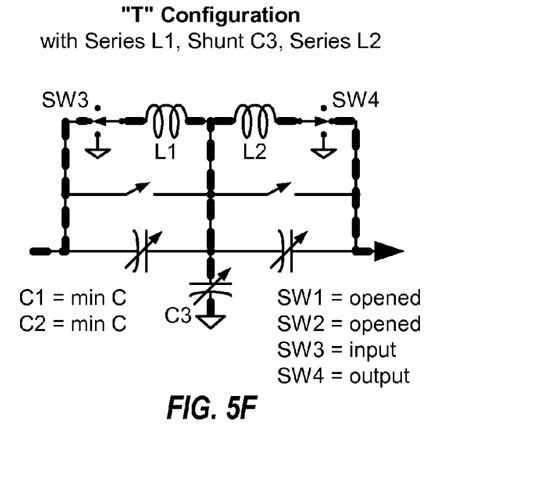

FIG. 5F shows impedance matching circuit 410 in a "T" configuration with series L1, shunt C3, and series L2. In this configuration, an input signal is passed through switch SW3 and inductor L1, applied to varactor C3, and passed through inductor L2 and switch SW4 to the output of impedance matching circuit 410.

In general, an impedance matching circuit may include any number of reactive elements and any number of switches, which may be coupled in any manner. A reactive element may be an inductor or a capacitor. An impedance matching circuit may support any number of configurations, which may include one or more of the following configurations:

Through configuration without any L or C,
Series configuration with series L and/or series C,
Shunt configuration with shunt L and/or shunt C,
"L" configuration with (i) series C and shunt L, (ii) series L and shunt C, (iii) series C and shunt C, or (iv) series L and shunt L,
"R" configuration with (i) shunt C and series L, (ii) shunt L and series C, (iii) shunt C and series C, or (iv) shunt L and series L,
"Pi" configuration with (i) shunt C, series L, and shunt C or (ii) shunt L, series C, and shunt L,
"T" configuration with (i) series C, shunt L, and series C or (ii) series L, shunt C, and series L, and
Other configurations.

An impedance matching circuit may also support other configurations.

An impedance matching circuit may be used for impedance matching of a load circuit (e.g., an antenna) in various manners. The load circuit may have different impedance values at different frequencies. The impedance matching circuit should match the impedance of the load circuit at a selected operating frequency.

In an aspect, an impedance matching circuit may be pre-characterized during the design phase, manufacturing, and/or field operation based on measurements, computer simulation, etc. The performance of the impedance matching circuit may be pre-characterized for a plurality of settings of the impedance matching circuit (or circuit settings). Each circuit setting may be associated with (i) a specific configuration of the impedance matching circuit, (ii) specific settings of switches in the impedance matching circuit, (iii) specific control settings for variable reactive elements in the impedance matching circuit, and (iv) a performance characterization. The plurality of circuit settings may correspond to different configurations of the impedance matching circuit and/or different values of the variable reactive elements within the impedance matching circuit. The performance characterizations for different circuit settings may be stored in a look-up table (LUT) and used to tune the impedance matching circuit.

Figure 6:
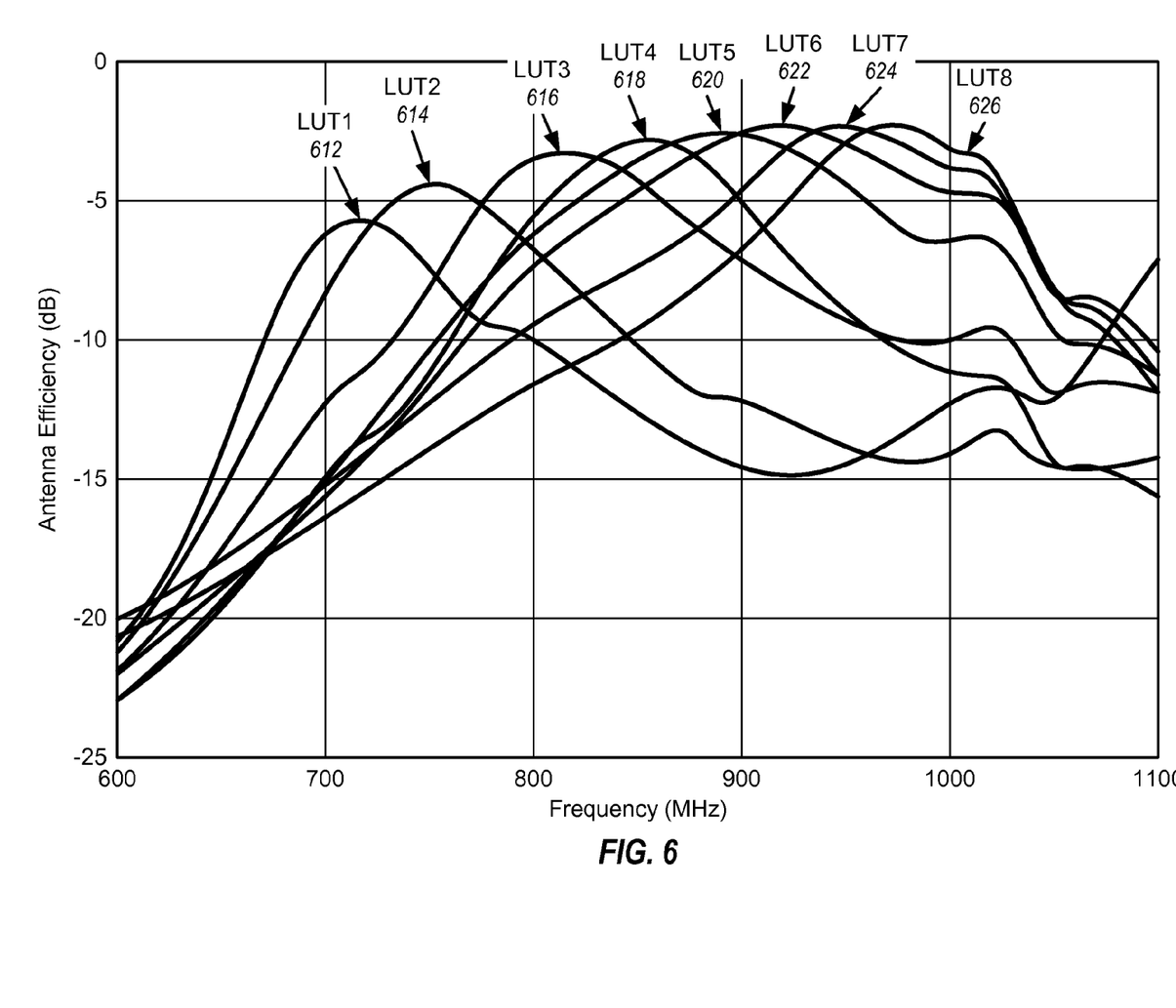
FIG. 6 shows plots of antenna efficiency for eight different settings of an impedance matching circuit.

FIG. 6 shows plots of antenna efficiency for eight different circuit settings of an impedance matching circuit for low frequency band in accordance with one exemplary design. In FIG. 6, the horizontal axis represents frequency in units of MHz, and the vertical axis represents antenna efficiency in units of decibel (dB). Antenna efficiency versus frequency for eight different circuit settings denoted as LUT1 through LUT8 is shown by plots 612 through 626, respectively. As shown in FIG. 6, each circuit setting has a peak antenna efficiency at a particular frequency and may provide good performance for a range of frequencies covering the peak antenna efficiency. The eight circuit settings may be chosen such that the peak antenna efficiency for these circuit settings occur at different frequencies, which may be spaced apart as evenly as possible. Alternatively, the eight circuit settings may be chosen such that the peak antenna efficiency for these circuit settings occur at different frequency bands or channels that may be used for communication. In either case, one circuit setting may be selected for use based on an operating frequency of a wireless device. For example, the LUT3 setting may be selected when operating at 800 MHz, the LUT5 setting may be selected when operating at 900 MHz, etc. The frequency response for the selected LUT setting may be varied by adjusting one or more variable reactive elements in the impedance matching circuit.

FIG. 6 shows a set of frequency responses for different circuit settings of an impedance matching circuit for low frequency band. A set of frequency responses may also be obtained for different circuit settings of the impedance matching circuit for high frequency band, e.g., over 1 GHz.

In general, the performance of an impedance matching circuit may be pre-characterized for any number of circuit settings, e.g., during design phase, manufacturing, field operation, etc. For example, one configuration of the impedance matching circuit may be selected at a time for evaluation. For each selected configuration, one or more parameters such as delivered power, return loss, and/or PA current may be measured, possibly for different values of variable reactive element(s) in the impedance matching circuit. A set of circuit settings having the peak/best performance at different frequencies may be selected and stored. Each selected circuit setting may provide good transmit and/or receive performance for a particular range of frequencies.

The selected set of circuit settings may be arranged in a monotonic order versus frequency, from the circuit setting with the best performance at the lowest frequency to the circuit setting with the best performance at the highest frequency. By pre-characterizing different circuit settings and arranging them in a monotonic order, a search for the best circuit setting can be more easily and accurately performed. For example, a circuit setting corresponding to an operating frequency of a wireless device may be selected for use. As another example, a search for the best circuit setting may be performed, and one circuit setting may be selected at a time (e.g., in increasing frequency) and evaluated to determine which circuit setting is the best. In both examples, tuning of the impedance matching circuit may be improved by pre-characterizing different circuit settings of the impedance matching circuit.

The performance of an impedance matching circuit may be pre-characterized for a number of circuit settings and the same load circuit, as described above. The performance of an impedance matching circuit may also be pre-characterized for a number of circuit settings and different load circuits coupled to the input and/or output of the impedance matching circuit. For example, the impedance matching circuit may be coupled to different TX filters and/or different RX filters in different modes, e.g., LTE, cdma2000, WCDMA, GSM, etc.

Figure 7:
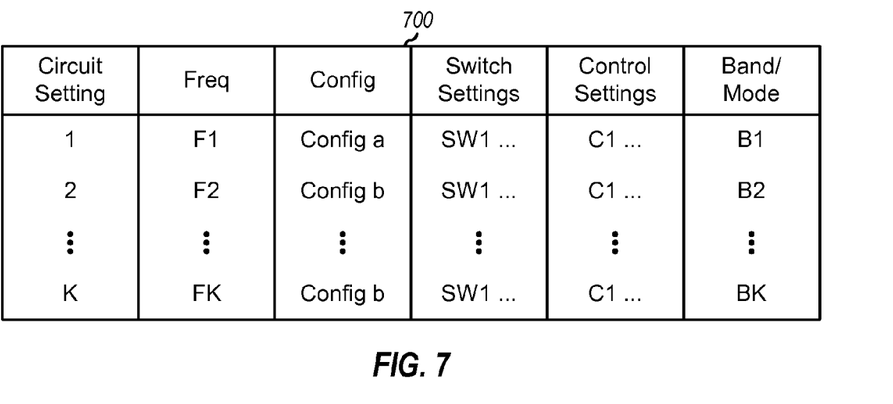
FIG. 7 shows a look-up table for an impedance matching circuit.

FIG. 7 shows an exemplary design of a look-up table (LUT) 700 for an impedance matching circuit. In this exemplary design, K circuit settings of the impedance matching circuit having peak/best performance at K different frequencies may be selected, where K may be any integer value. Look-up table 700 may store pertinent information for each circuit setting such as (i) a frequency or a range of frequencies for which the circuit setting is applicable, (ii) specific settings of switches in the impedance matching circuit, (iii) specific control settings for variable reactive elements in the impedance matching circuit, (iv) a frequency band and/or a mode (e.g., LTE, cdma2000, WCDMA, GSM, etc.) for which the circuit setting is applicable. Look-up table 700 may be stored in a non-volatile memory (e.g., memory 112 in FIG. 1).

With look-up table 700, impedance matching may be performed by selecting a suitable circuit setting based on an operating frequency of a wireless device. The switch settings and the control settings for the selected circuit setting may be retrieved from look-up table 700. The retrieved switch settings may be applied to switches, and the retrieved control settings may be applied to variable reactive elements within the impedance matching circuit.

An impedance matching circuit may be used to match the impedance of an antenna on a wireless device to a target impedance, e.g., as shown in FIG. 1. The impedance of the antenna may vary widely from one antenna design to another. Furthermore, the antenna impedance may vary widely with frequency. The wireless device (e.g., a cellular phone or a smart phone) is typically held in a user's hand and may be placed next to the user's ear and head. The antenna impedance may change due to proximity of human body (e.g., hand, ear, etc.) on the wireless device.

Figure 8A:
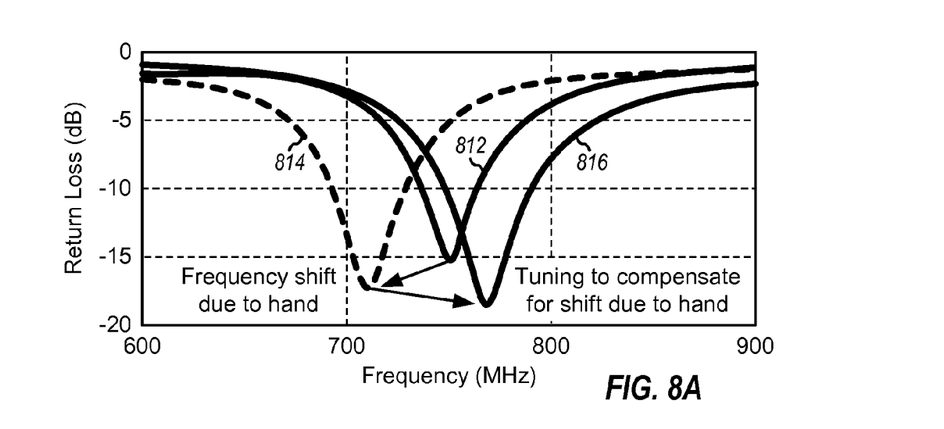
FIGS. 8A and 8B show return loss and antenna efficiency, respectively, for an impedance matching circuit in different scenarios.

FIG. 8A shows return loss (S11) of an impedance matching circuit coupled to an antenna in a wireless device for different scenarios. In FIG. 8A, the horizontal axis represents frequency in units of MHz, and the vertical axis represents return loss in units of dB. The impedance matching circuit may have a plurality of circuit settings (e.g., eight circuit settings as shown in FIG. 6), which may be associated with peak performance at different frequencies. The impedance matching circuit may have a return loss in free space shown by a plot 812, with the wireless device not being held in a user's hand. The impedance matching circuit may have a return loss shown by a plot 814 when the wireless device is held in the user's hand. Body effects may attenuate and shift the resonant frequency of the antenna, which may cause a corresponding frequency shift in the return loss of the impedance matching circuit. Plot 812 may be obtained with LUT2 setting in FIG. 6. LUT3 setting with peak performance at a higher frequency may be selected. The impedance matching circuit may have a return loss shown by a plot 816 with LUT3 setting when the wireless device is held in the user's hand. The shift in frequency due to body effect may thus be compensated by selecting another circuit setting for the impedance matching circuit.

Figure 8B:
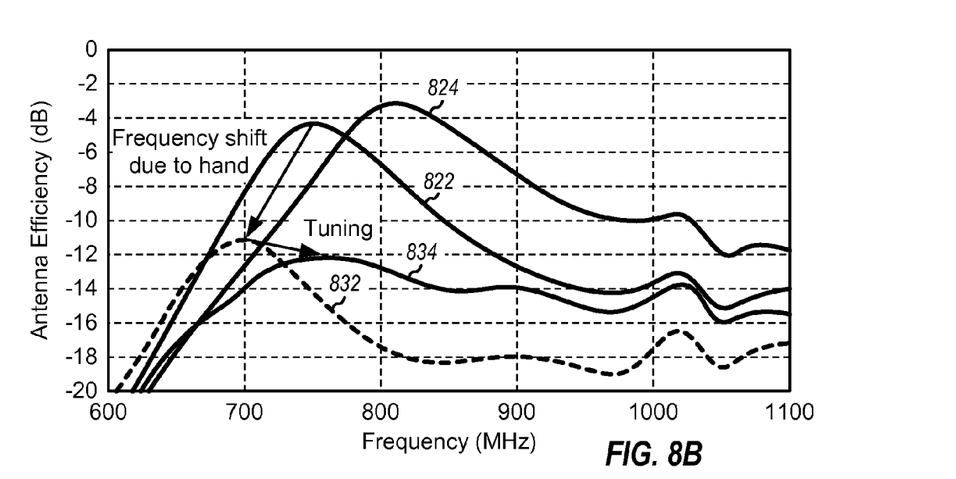

FIG. 8B shows antenna efficiency for an impedance matching circuit coupled to an antenna in a wireless device for different scenarios. A plot 822 shows antenna efficiency for LUT2 setting in free space, and a plot 824 shows antenna efficiency for LUT3 setting in free space. A plot 832 shows antenna efficiency for LUT2 setting with the wireless device held in the user's hand. A plot 834 shows antenna efficiency for LUT3 setting with the wireless device held in the user's hand. As shown in FIG. 8B, LUT2 setting has the best antenna efficiency at 750 MHz in free space, but LUT3 setting has better antenna efficiency than LUT2 setting at 750 MHz when the wireless device is held in the user's hand. Switching to LUT3 setting when the wireless device is held in the user's hand improves antenna efficiency.

A frequency response for a given circuit setting of an impedance matching circuit typically shifts lower in frequency when placed in close proximity to human body, e.g., hand, ear, etc. This shift in frequency may be compensated by selecting another circuit setting with a peak performance at a higher frequency in free space, e.g., as shown in FIG. 8B. A plurality of circuit settings for the impedance matching circuit may be ordered based on their peak performance frequencies, from lowest frequency to highest frequency, e.g., as shown in FIG. 6. In this case, the next circuit setting may be selected for evaluation whenever a frequency response is detected to have shifted. Ordering the plurality of circuit settings may thus simplify tuning of the impedance matching circuit.

In another aspect, an impedance matching circuit in a wireless device may be tuned based on measurements for one or more parameters such as delivered power, return loss, PA current, antenna/load impedance, etc. The measurements may be made by an adaptive tuning circuit during normal/field operation of the wireless device. The measurements may be used to tune the impedance matching circuit such that good performance can be achieved for the wireless device.

Figure 9:
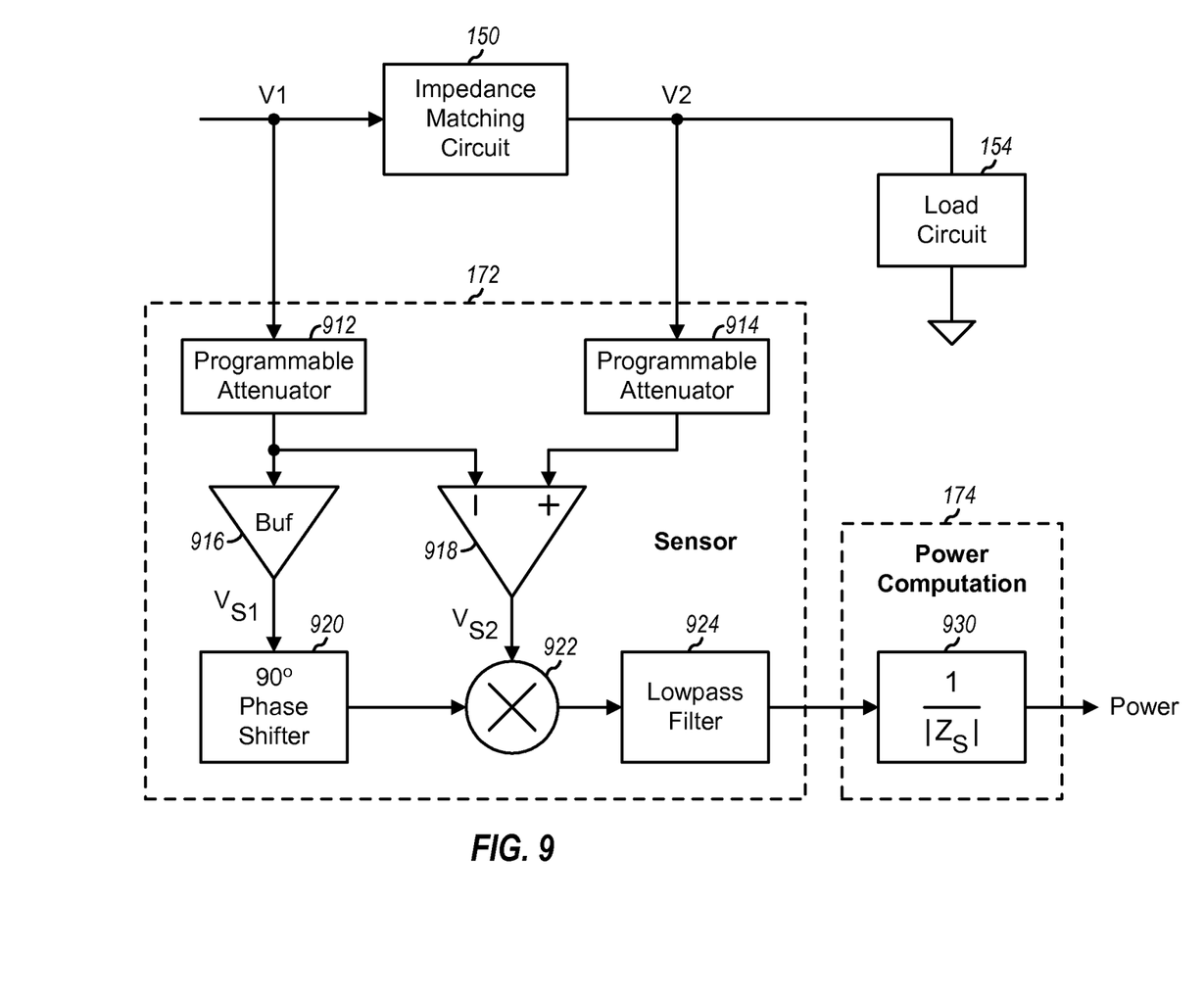
FIG. 9 shows a block diagram of a sensor and a computation unit.

FIG. 9 shows a block diagram of an exemplary design of sensor 172 and computation unit 174 in FIG. 1. Within sensor 172, a programmable attenuator 912 receives a V1 signal at the input of impedance matching circuit 150 and provides a first input signal. A programmable attenuator 914 receives a V2 signal at the output of impedance matching circuit 150 and provides a second input signal. Programmable attenuators 912 and 914 may provide variable amounts of attenuation depending on the output power level in order to reduce the dynamic range of the input signals provided to the circuits within sensor 172. A buffer (Buf) 916 receives and buffers the first input signal and provides a first sensed signal, $V_{S1}$, which may be a scaled version of the V1 signal. A phase shifter 920 receives and shifts the $V_{S1}$ signal by 90° at the frequency of interest and provides a phase-shifted signal. A fixed-gain amplifier 918 receives the first input signal at an inverting input and the second input signal at a non-inverting input and provides a second sensed signal, $V_{S2}$. The $V_{S2}$ signal may be indicative of the voltage drop across impedance matching circuit 150. A multiplier 922 multiplies the phase-shifted signal from phase shifter 920 with the $V_{S2}$ signal from amplifier 918 and provides a multiplier output signal. A lowpass filter 924 receives the multiplier output signal, filters out high frequency components, and provides a sensor output, $Y_{OUT}$.

Within computation unit 170, a unit 930 receives and divides the sensor output by the magnitude of a series impedance, $Z_S$, of impedance matching circuit 150 and provides the delivered power, $P_{OUT}$, which may be expressed as:

$$P_{OUT} = V_{AMP\_PK} \cdot I_{LOAD\_PK} \cdot \cos(\phi), \qquad \text{Eq (1)}$$

where
  $V_{AMP\_PK}$ is a peak voltage of the $V_{S1}$ signal,
  $I_{LOAD\_PK}$ is a peak current delivered to a load circuit 154, and
  $\phi$ is a phase that is dependent on mismatch between impedance matching circuit 150 and load circuit 154 and may be close to 0 degrees with good matching.

In the exemplary design shown in FIG. 9, the V1 signal is phase shifted and multiplied with the $V_{S2}$ signal. The Pour power in equation (1) may then be the power delivered to impedance matching circuit 150 and load circuit 154. Load circuit 154 may model antenna 152. Since impedance matching circuit 150 may have a small loss, most of the $P_{OUT}$ power may be delivered to load circuit 154.

In another exemplary design that is not shown in FIG. 9, the V2 signal may be phase shifted and multiplied with the $V_{S1}$ signal. The output power may then be the power delivered to load circuit 154. The output power from computation unit 174 may thus be indicative of the power delivered at the point in which a signal is tapped and provided to phase shifter 920.

The series impedance, $Z_S$, is the impedance between the input and output of impedance matching circuit 150. The magnitude of the series impedance, $|Z_S|$, may be determined in various manners. In one design, $|Z_S|$ may be determined via computer simulation, empirical measurement, or other means. In another design, $|Z_S|$ may be calibrated ahead of time. For example, the sensor output may be measured for a known output power, and $|Z_S|$ may be determined based on the known output power and the measured sensor output. $|Z_S|$ may also be determined in other manners.

The load impedance, $Z_L$, of load circuit 154 may be determined based on a load voltage, $V_L$, at load circuit 154 and a load current, $I_L$, provided to load circuit 154. The load voltage may be determined by measuring the V2 signal. The load current may be determined by measuring the voltage drop across the series impedance and dividing this voltage drop by the series impedance. If load circuit 154 corresponds to an antenna, then the load impedance would correspond to an antenna impedance. The load impedance may be used to compute various parameters.

A reflection coefficient $\Sigma$ may be computed based on the load impedance, as follows:

$$\rho = \frac{Z_L - Z_O}{Z_L + Z_O}, \qquad \text{Eq (2)}$$

where $Z_O$ is a characteristics impedance and may be 50 Ohms or some other value.

A return loss in units of dB may be expressed as:

$$\text{Return Loss(dB)} = 10 * \log_{10}(\rho^2). \qquad \text{Eq (3)}$$

A mismatch loss in units of dB may be expressed as:

$$\text{Mismatch Loss(dB)} = -10 * \log_{10}(1 - \rho^2). \qquad \text{Eq (4)}$$

The incident power, delivered power, and reflected power may be expressed as:

$$P_{delivered} = P_{incident} - P_{reflected}, \qquad \text{Eq (5)}$$

where
- $P_{delivered}$ is the power delivered to load circuit 154 (or radiated by antenna),
- $P_{incident}$ is the power provided to impedance matching circuit 150, and
- $P_{reflected}$ is the reflected power due to mismatch at load circuit 154.

The delivered power may also be expressed as $P_{delivered} = (1-|\rho|^2) \cdot P_{incident}$. The reflected power may also be expressed as $P_{reflected} = |\rho|^2 \cdot P_{incident}$.

The return loss and mismatch loss may be expressed based on the incident power and reflected power, as follows:

$$\text{Return Loss (dB)} = 10 * \log_{10}\left(\frac{P_{incident}}{P_{reflected}}\right), \text{ and} \quad \text{Eq (6)}$$

$$\text{Mismatch Loss (dB)} = 10 * \log_{10}\left(\frac{P_{delivered}}{P_{incident}}\right). \quad \text{Eq (7)}$$

FIG. 9 shows an exemplary design of sensor 172 and computation unit 174 that can measure the delivered power and/or other parameters via impedance matching circuit 150. The delivered power and/or other parameters may also be measured in other manners. Antenna/load impedance may be determined based on voltage measurements from sensor 172.

In general, M measurements at M different points in an impedance matching circuit may be used to solve M variables or unknown. For example, three voltage measurements V1, V2 and V3 may be used to determine antenna impedance, delivered power, and incident power. Other parameters such as return loss, mismatch loss, reflected power, etc., may be computed from the parameters obtained via measurements.

PA current may be measured in various manners. In an exemplary design, PA current may be measured directly. For example, a bias current for a power amplifier may be provided via a transistor. A current mirror that includes this transistor may be used to obtain a scaled version of the bias current, which may be measured. In another exemplary design, PA current may be measured indirectly. For example, the relationship between bias voltage for a gain transistor in a power amplifier and bias current for the power amplifier may be characterized and stored. A bias voltage may be applied to the gain transistor, and the bias current for the power amplifier may be determined based on the applied bias voltage.

In general, any number of parameters and any parameter may be determined based on measurements. In an exemplary design, measurements may be made during design phase, manufacturing, and/or field operation and used to build look-up table 700. For example, measurements for different possible circuit settings of an impedance matching circuit may be made during the design phase, manufacturing, and/or field operation and used to compute return loss, mismatch loss, delivered power, etc. Look-up table 700 may then be built based on parameter values obtained for different circuit settings of the impedance matching circuit. In an exemplary design, measurements may be made during field operation and used to adjust the impedance matching circuit to provide good performance.

Figure 10:
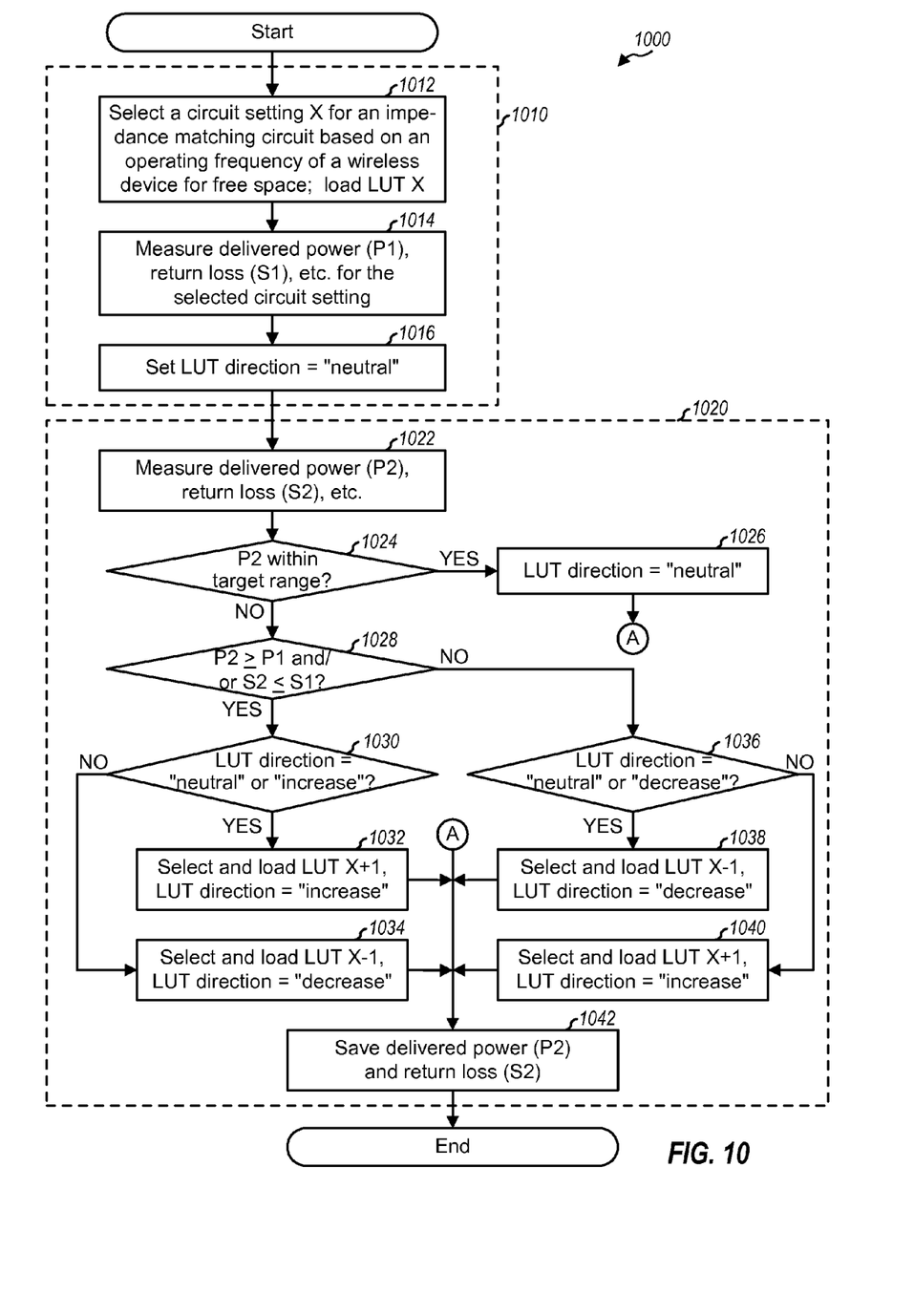
FIG. 10 shows a process for tuning an impedance matching circuit.

FIG. 10 shows an exemplary design of a process 1000 for tuning an impedance matching circuit in a wireless device based on measurements. Process 1000 includes an initialization phase 1010 and an operational phase 1020. Initialization phase 1010 may be performed once, e.g., at the start of a communication session. Operational phase 1020 may be performed one or more times during the communication session.

In initialization phase 1010, a circuit setting X may be selected for the impedance matching circuit based on an operating frequency of the wireless device for free space (block 1012). For example, the LUT2 setting in FIG. 6 may be selected if the operating frequency is 750 MHz. The selected circuit setting X may be denoted as LUT setting X or LUT X, where X is an index of the selected circuit setting. The impedance matching circuit may be configured or set to LUT setting X (also block 1012). Delivered power (P1), return loss (S1), PA current (I1) and/or other parameters may be measured for LUT setting X and may be stored on the wireless device (block 1014). The direction of LUT adjustment (or LUT direction) may be set to "neutral" (block 1016). The LUT direction may be set to "neutral" initially to allow the next higher or next lower circuit setting to be selected for the impedance matching circuit.

In operational phase 1020, the delivered power (P2), return loss (S2), PA current (I2), and/or other parameters may be measured for the current LUT setting X (block 1022). A determination is then made whether the most recent measurement of delivered power is within a target range (block 1024). If the answer is "Yes", then the direction of LUT adjustment may be set to "neutral" (block 1026). Otherwise, a comparison may be made between the most recent measurements of delivered power, return loss, PA current, and/or other parameters and the saved measurements (block 1028). If the most recent measurements are better than the saved measurements (e.g., if P2≥P1 and/or S2≤S1), then a determination may be made whether the current LUT direction is set to "neutral" or "increase" (block 1030). If the answer is "Yes" for block 1030, then the next higher circuit setting X+1 may be selected, the impedance matching circuit may be set to the new LUT setting X+1, and the LUT direction may be set to "increase" (block 1032). Otherwise, if the answer is "No" for block 1030, then the next lower circuit setting X−1 may be selected, the impedance matching circuit may be set to the new LUT setting X−1, and the LUT direction may be set to "decrease" (block 1034).

If the most recent measurements are not better than the saved measurements ("No" for block 1028), then a determination may be made whether the current LUT direction is set to "neutral" or "increase" (block 1036). If the answer is "Yes" for block 1036, then the next lower circuit setting X−1 may be selected, the impedance matching circuit may be set to the new LUT setting X−1, and the LUT direction may be set to "decrease" (block 1038). Otherwise, if the answer is "No" for block 1036, then the next higher circuit setting X+1 may be selected, the impedance matching circuit may be set to the new LUT setting X+1, and the LUT direction may be set to "increase" (block 1040). After block 1032, 1034, 1038 or 1040, the most recent measurements may be saved on the wireless device for use in the next tuning cycle (block 1042).

The operation of process 1000 may be illustrated by two scenarios. In a first example, initialization phase 1010 may be performed when the wireless device is in free space, and operational phase 1020 may be performed when the wireless device is in close proximity to human body. In this example, P2 is likely less than P1, and S2 is likely greater than S1. Block 1040 may be performed to (i) increase the circuit setting to compensate for the shift to lower frequency due to the close proximity to human body and (ii) set the LUT direction to "increase" to possibly select the next higher circuit setting. In a second example, initialization phase 1010 may be performed when the wireless device is in close proximity to human body, and operational phase 1020 may be performed when the wireless device is in free space. In this example, P2 is likely greater than P1, and S2 is likely less than S1. Block 1034 may be performed to (i) decrease the circuit setting and (ii) set the LUT direction to "decrease" to possibly select the next lower circuit setting.

Blocks 1022 through 1042 may be performed periodically to iteratively search for the circuit setting that can provide the best performance, e.g., the best delivered power, or return loss, or PA current. This iterative search can compensate for shift in the resonant frequency of an antenna (e.g., due to close proximity of human body), which may improve performance for transmission and/or reception.

In yet another aspect, an impedance matching circuit in a wireless device may be tuned based on contextual information for the wireless device. The contextual information may be any information related to the user of the wireless device or its environment/surrounding. The contextual information may be obtained via various sensors such as a proximity sensor, an accelerometer, an infrared sensor, a temperature sensor, etc. The contextual information may be used to tune the impedance matching circuit such that good performance can be achieved for the wireless device.

In general, an impedance matching circuit may be tuned based on any set of inputs, which may include measurements, contextual information, a selected operating frequency of a wireless device, a selected mode of the wireless device, etc. The inputs may be used to select an initial circuit setting for the impedance matching circuit. Thereafter, measurements (e.g., for delivered power, return loss, PA current, antenna/load impedance, etc.) may be obtained (e.g., occasionally or periodically) for the current circuit setting. The measurements may be used to select another circuit setting for the impedance matching circuit. The iterative search for the circuit setting with the best performance (e.g., the best delivered power, return loss, PA current, etc.) may be facilitated by a set of pre-characterized circuit settings stored in a look up table. This set of circuit settings may be arranged in a predetermined order, e.g., based on their peak performance frequencies, as shown in FIG. 6. This predetermined order may simplify selection of the next circuit setting to evaluate, e.g., as shown in FIG. 10.

The adaptive tuning techniques described herein may provide various advantages. The techniques may provide better impedance matching over a wider range of frequencies. The techniques can support operation on a single frequency band or multiple frequency bands and may be able to extend the frequency of operation of a wireless device. The techniques may also support impedance matching for different input and/or output load, e.g., for different modes. The techniques may also support carrier aggregation, which is simultaneous transmission on multiple carriers. Each carrier may have a particular bandwidth (e.g., 20 MHz or less). The techniques may also support multiple-input-multiple-output (MIMO) operation, receive diversity, transmit diversity, etc.

In an exemplary design, an apparatus (e.g., a wireless device, an IC, a circuit module, etc.) may comprise a memory and a control unit. The memory (e.g., memory 112 in FIG. 1) may store information for a plurality of settings of an impedance matching circuit, e.g., in a look-up table such as look-up table 700 in FIG. 7. The control unit (e.g., control unit 180 in FIG. 1) may select one of the plurality of settings of the impedance matching circuit based on the information for the plurality of settings and measurements for the impedance matching circuit.

In an exemplary design, the performance of the impedance matching circuit may be pre-characterized for each of the plurality of settings. The pre-characterization may be performed during the design phase, manufacturing, and/or field operation. The memory may store information indicative of the performance of the impedance matching circuit for the plurality of settings. The plurality of settings may be associated with different frequencies at which peak performance is obtained, e.g., as shown in FIG. 6. The plurality of settings may be ordered based on the frequencies at which the peak performance is obtained. In an exemplary design, the memory may store, for each setting, information indicative of a frequency or a range of frequencies for which the setting is applicable, at least one switch setting for at least one switch within the impedance matching circuit, at least one control setting for at least one variable reactive element within the impedance matching circuit, or a combination thereof, e.g., as shown in FIG. 7.

In an exemplary design, the measurements may relate to delivered power, return loss, load impedance, PA current, or a combination thereof. The control unit may select one of the plurality of settings of the impedance matching circuit based on the measurements.

In an exemplary design, the control unit may select an initial setting for the impedance matching circuit based on an operating frequency of a wireless device, e.g., as shown in block 1012 in FIG. 10. The control unit may select a next higher setting or a next lower setting in the plurality of settings based on the measurements for the impedance matching circuit, e.g., as shown in block 1032, 1034, 1038 or 1040 in FIG. 10. The next lower setting may be the setting with peak performance at a frequency that is lower than, and closest to, the frequency of peak performance for the initial setting. The next higher setting may be the setting with peak performance at a frequency that is higher than, and closest to, the peak performance frequency for the initial setting. For example, the initial setting may be LUT2 setting in FIG. 6, the next lower setting may be LUT1 setting, and the next higher setting may be LUT3 setting. In an exemplary design, the control unit may (i) periodically receive the measurements for the impedance matching circuit and (ii) periodically determine whether to maintain the current setting or select a new setting for the impedance matching circuit based on the measurements.

In an exemplary design, the control unit may select one of the plurality of settings based further on contextual information for the wireless device. The control unit may also select a setting based on other information.

In another exemplary design, an apparatus (e.g., a wireless device, a circuit module, etc.) may comprise a load circuit and an impedance matching circuit. The impedance matching circuit (e.g., impedance matching circuit 150 in FIG. 1) may perform impedance matching for the load circuit based on one of a plurality of settings, which may be selected for the impedance matching circuit based on information for the plurality of settings and measurements for the impedance matching circuit. In an exemplary design, the impedance matching circuit may comprise a plurality of reactive elements and at least one switch and may support a plurality of configurations, e.g., as shown in FIG. 4. The plurality of configurations may include a series configuration, a shunt configuration, an "L" configuration, an "R" configuration, a "Pi" configuration, a "T" configuration, or a combination thereof. The plurality of settings of the impedance matching circuit may be associated with some or all of the plurality of configurations of the impedance matching circuit.

In an exemplary design, the load circuit may comprise an antenna, and the impedance matching circuit may perform impedance matching for the antenna, e.g., as shown in FIG. 1. In another exemplary design, the load circuit may comprise a power amplifier, and the impedance matching circuit may perform output impedance matching for the power amplifier, e.g., as shown in FIG. 3. In yet another exemplary design, the load circuit may comprise an LNA, and the impedance matching circuit may perform input impedance matching for the LNA. The impedance matching circuit may also perform impedance matching for other types of load circuit.

Figure 11:
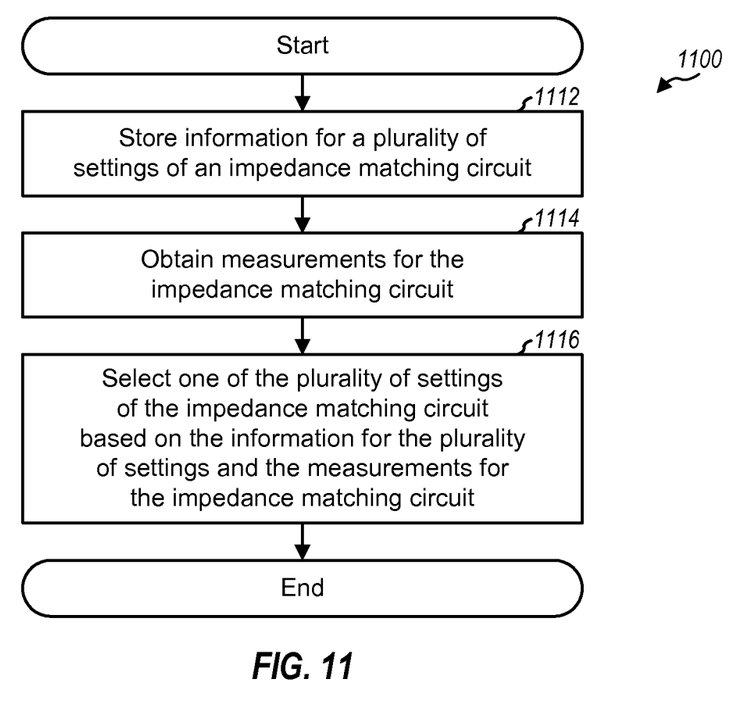
FIG. 11 shows a process for performing impedance matching.

FIG. 11 shows an exemplary design of a process 1100 for performing impedance matching. Information for a plurality of settings of an impedance matching circuit may be stored, e.g., in a look-up table on a memory (block 1112). Measurements for the impedance matching circuit may be obtained (block 1114). One of the plurality of settings of the impedance matching circuit may be selected based on the information for the plurality of settings and the measurements for the impedance matching circuit (block 1116).

In an exemplary design, the performance of the impedance matching circuit may be pre-characterized for each of the plurality of settings. Information indicative of the performance of the impedance matching circuit for the plurality of settings may be stored and used to select a setting for use.

In an exemplary design, the measurements may relate to delivered power, return loss, load impedance, PA current, or a combination thereof. One of the plurality of settings of the impedance matching circuit may be selected based on the measurements.

In an exemplary design, an initial setting for the impedance matching circuit may be selected based on an operating frequency of a wireless device. Thereafter, a next higher setting or a next lower setting in the plurality of settings may be selected based on the measurements for the impedance matching circuit. In an exemplary design, measurements for the impedance matching circuit may be periodically obtained. A determination of whether to maintain the current setting or select a new setting for the impedance matching circuit may be periodically made based on the measurements.

The impedance matching circuit, the adaptive tuning circuit, and the adaptive tuning techniques described herein may be implemented on an IC, an analog IC, an RFIC, a mixed-signal IC, an ASIC, a printed circuit board (PCB), an electronic device, etc. The impedance matching circuit and adaptive tuning circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the impedance matching circuit, the adaptive tuning circuit, and the adaptive tuning techniques described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
  a sensor configured to obtain measurements for an impedance matching circuit; and
  a control unit configured to select one of the plurality of settings of the impedance matching circuit based on information for the plurality of settings and the measurements for the impedance matching circuit, the impedance matching circuit including at least one reactive element that is reconfigurably connectable as either a series element or a shunt element.

2. The apparatus of claim 1, wherein performance of the impedance matching circuit is pre-characterized for each of the plurality of settings, and wherein the apparatus is configured to store information indicative of the performance of the impedance matching circuit for the plurality of settings.

3. The apparatus of claim 1, wherein the plurality of settings of the impedance matching circuit are associated with different frequencies at which peak performance is obtained, and wherein the plurality of settings of the impedance matching circuit are ordered based on the frequencies at which the peak performance is obtained.

4. The apparatus of claim 1, further comprising a memory configured to store, for each of the plurality of settings, information indicative of a frequency or a range of frequencies for which the setting is applicable, at least one switch setting for at least one switch within the impedance matching circuit, at least one control setting for at least one variable reactive element within the impedance matching circuit, or a combination thereof.

5. The apparatus of claim 1, wherein the measurements relate to at least one of delivered power, return loss, and load impedance.

6. The apparatus of claim 1, wherein the control unit is configured to select an initial setting for the impedance matching circuit based on an operating frequency of a wireless device, and to select a next higher setting or a next lower setting in the plurality of settings based on the measurements for the impedance matching circuit.

7. The apparatus of claim 1, wherein the control unit is configured to periodically receive the measurements for the impedance matching circuit and to periodically determine whether to maintain a current setting or select a new setting for the impedance matching circuit based on the measurements.

8. The apparatus of claim 1, wherein the control unit is configured to select one of the plurality of settings of the impedance matching circuit based further on contextual information for a wireless device.

9. An apparatus comprising:
   means for obtaining measurements for an impedance matching circuit; and
   means for selecting one of a plurality of settings of the impedance matching circuit based on information for the plurality of settings and the measurements for the impedance matching circuit, the impedance matching circuit including at least one reactive element that is reconfigurably connectable as either a series element or a shunt element.

10. The apparatus of claim 9, wherein the measurements relate to at least one of delivered power, return loss, and load impedance.

11. The apparatus of claim 9, the means for selecting comprising:
   means for selecting an initial setting for the impedance matching circuit based on an operating frequency of a wireless device, and
   means for selecting a next higher setting or a next lower setting in the plurality of settings based on the measurements for the impedance matching circuit.

12. The apparatus of claim 9, the means for obtaining measurements comprising means for periodically obtaining the measurements for the impedance matching circuit, and the means for selecting comprising means for periodically determining whether to maintain a current setting or select a new setting for the impedance matching circuit based on the measurements.

13. The apparatus of claim 9, further comprising:
   means for storing the information for the plurality of settings of the impedance matching circuit.

14. The apparatus of claim 13, the means for storing comprising:
   means for storing information indicative of performance of the impedance matching circuit for the plurality of settings, the performance of the impedance matching circuit being pre-characterized for each of the plurality of settings.

\* \* \* \* \*